(12) United States Patent
Hashigami et al.

(10) Patent No.: US 12,074,078 B2
(45) Date of Patent: Aug. 27, 2024

(54) LAMINATE, FILM FORMING METHOD, AND FILM FORMING APPARATUS

(71) Applicant: SHIN-ETSU CHEMICAL CO., LTD., Tokyo (JP)

(72) Inventors: Hiroshi Hashigami, Annaka (JP); Takenori Watabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 350 days.

(21) Appl. No.: 17/414,073

(22) PCT Filed: Nov. 18, 2019

(86) PCT No.: PCT/JP2019/045034
§ 371 (c)(1),
(2) Date: Jun. 15, 2021

(87) PCT Pub. No.: WO2020/129508
PCT Pub. Date: Jun. 25, 2020

(65) Prior Publication Data
US 2022/0059424 A1 Feb. 24, 2022

(30) Foreign Application Priority Data
Dec. 19, 2018 (JP) .................. 2018-236960

(51) Int. Cl.
*H01L 23/31* (2006.01)
*H01L 21/56* (2006.01)
*H01L 23/29* (2006.01)

(52) U.S. Cl.
CPC ......... *H01L 23/3171* (2013.01); *H01L 21/56* (2013.01); *H01L 23/291* (2013.01)

(58) Field of Classification Search
CPC ... H01L 23/3171; H01L 21/56; H01L 23/291; H01L 21/02488; H01L 21/02414;
(Continued)

(56) References Cited

U.S. PATENT DOCUMENTS

2007/0293597 A1 12/2007 Fujii et al.
2015/0194479 A1 7/2015 Kaneko et al.
(Continued)

FOREIGN PATENT DOCUMENTS

CN 107799584 A 3/2018
JP 2013-028480 A 2/2013
(Continued)

OTHER PUBLICATIONS

May 31, 2022 Notification of Reasons for Refusal issued in Japanese Patent Application 2021-047355.
(Continued)

*Primary Examiner* — Elias Ullah
(74) *Attorney, Agent, or Firm* — Oliff PLC

(57) ABSTRACT

A laminate including: a crystal substrate; and a semiconductor film provided on a main surface of the crystal substrate, the semiconductor film being mainly made of an oxide semiconductor containing a dopant and having a corundum structure, where the oxide semiconductor has a silicon concentration of $5.0 \times 10^{20}$ cm$^{-3}$ or less, and the semiconductor film has a resistivity of 150 mΩ·cm or less. This provides a laminate including a semiconductor having low resistance and a corundum structure suitable for use in semiconductor devices.

2 Claims, 9 Drawing Sheets

(58) Field of Classification Search
CPC .......... H01L 21/0242; H01L 21/02483; H01L 21/02565; H01L 21/02576; H01L 21/0262; H01L 21/02628; H01L 21/02573; C23C 16/40; C23C 16/4481; C23C 16/45512

See application file for complete search history.

(56) References Cited

U.S. PATENT DOCUMENTS

| | | |
|---|---|---|
| 2015/0325659 A1 | 11/2015 | Hitora et al. |
| 2018/0061952 A1 | 3/2018 | Tokuda et al. |

FOREIGN PATENT DOCUMENTS

| | | |
|---|---|---|
| JP | 5397795 B1 | 1/2014 |
| JP | 2014-072463 A | 4/2014 |
| JP | 2015-228495 A | 12/2015 |
| JP | 2018-070422 A | 5/2018 |
| JP | 2018-082144 A | 5/2018 |
| KR | 10-2007-0085399 A | 8/2007 |

OTHER PUBLICATIONS

Jan. 18, 2023 Office Action issued in Taiwanese Patent Application No. 108146379.

Akaiwa, Kazuaki and Fujita, Shizuo, "Electrical Conductive Corundum-Structured α-Ga2O3 Thin Films on Sapphire with Tin-Doping Grown by Spray-Assisted Mist Chemical Vapor Deposition", Japanese Journal of Applied Physics, Jun. 14, 2012, vol. 51, p. 070203.1-p. 070203.3.

Feb. 10, 2020 International Search Report issued in International Patent Application No. PCT/JP2019/045034.

Jun. 16, 2021 International Preliminary Report on Patentability issued in International Patent Application No. PCT/JP2019/045034.

E. Chikoidze et al., "Electrical, optical, and magnetic properties of Sn doped α-Ga2O3 thin films", Journal of Applied Physics 120.2 (2016): 025109.

Akikawa, Kazuaki and Fujita, Shizuo, "Electrical Conductive Corundum-Structured α-Ga2O3 Thin Films on Sapphire with Tin-Doping Grown by Spray-Assisted Mist Chemical Vapor Deposition", Japanese Journal of Applied Physics, Jun. 14, 2012, vol. 51, p. 070203.1-p. 070203.3.

Nov. 30, 2022 Office Action issued in Indian Patent Application No. 202147026115.

Aug. 16, 2022 Extended Search Report Issued in application No. 19898090.6.

Jan. 5, 2024 Office Action issued in Korean Patent Application No. 10-2021-7017796 with partial translation.

Jun. 3, 2024 Office Action issued in Chinese Patent Application No. 201980082989.6.

Jun. 27, 2024 Office Action issued in European Patent Application No. 19898090.6.

[FIG. 1]
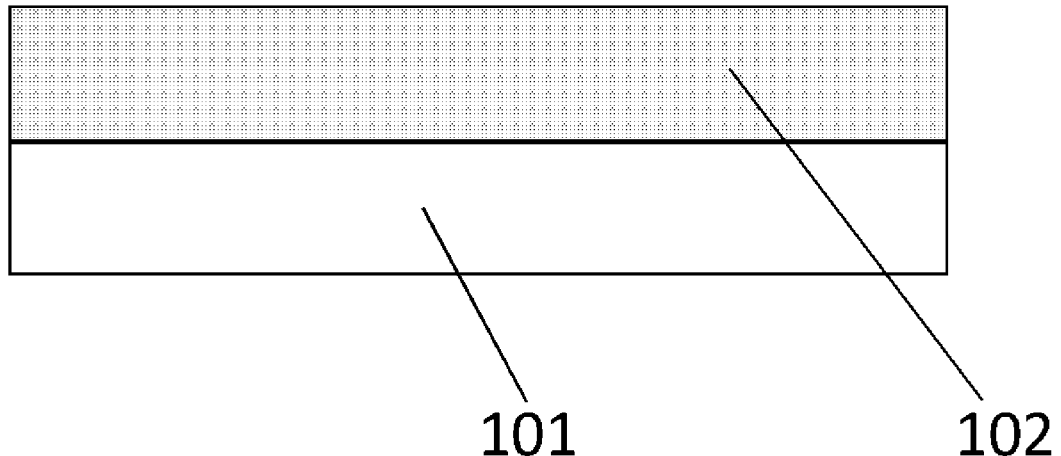
[FIG. 2]
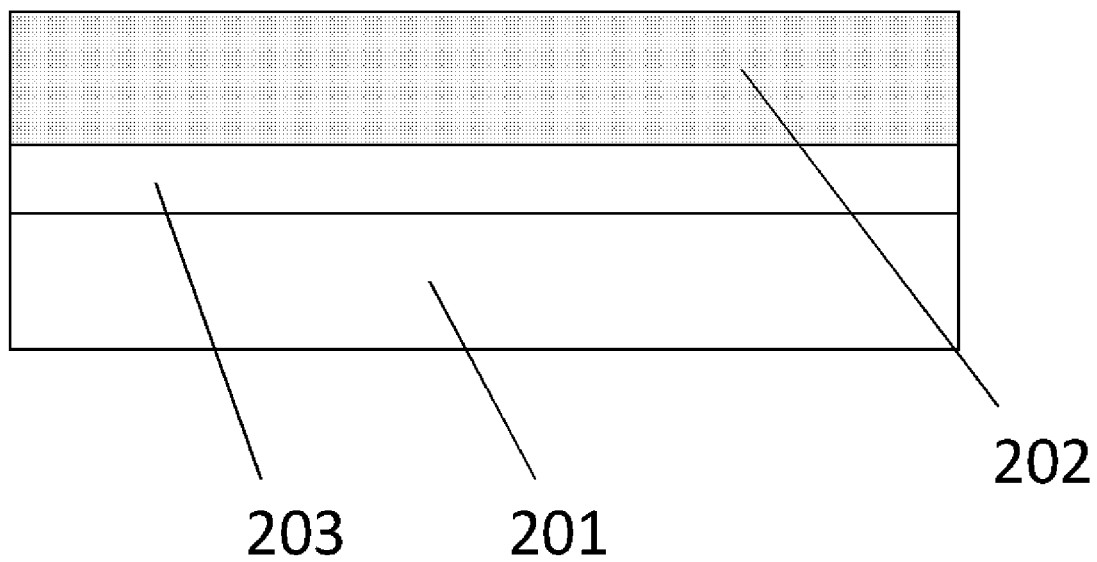

[FIG. 3]
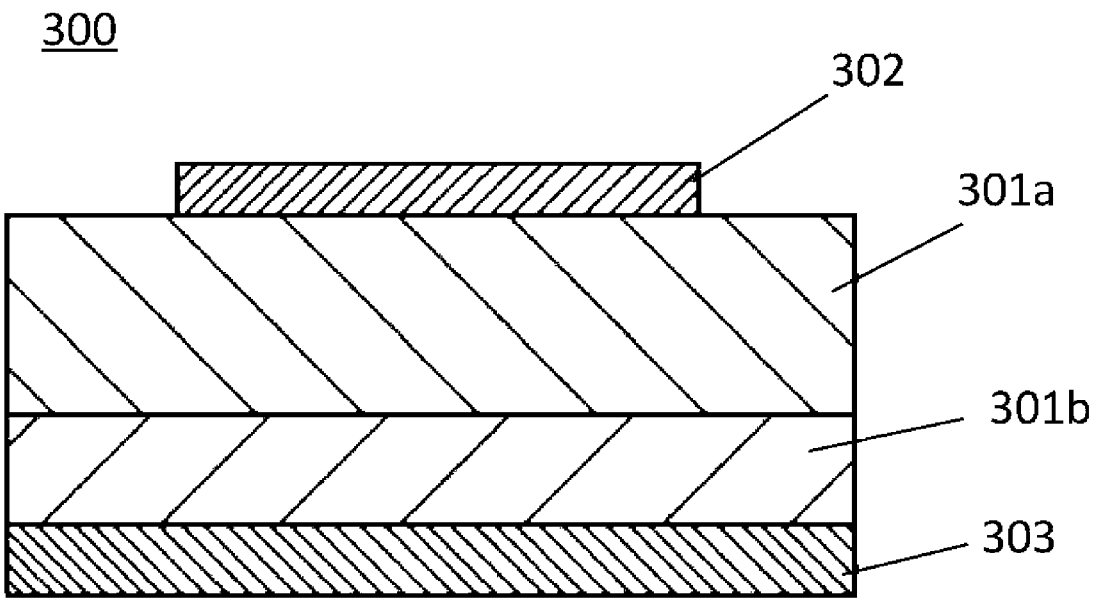
[FIG. 4]
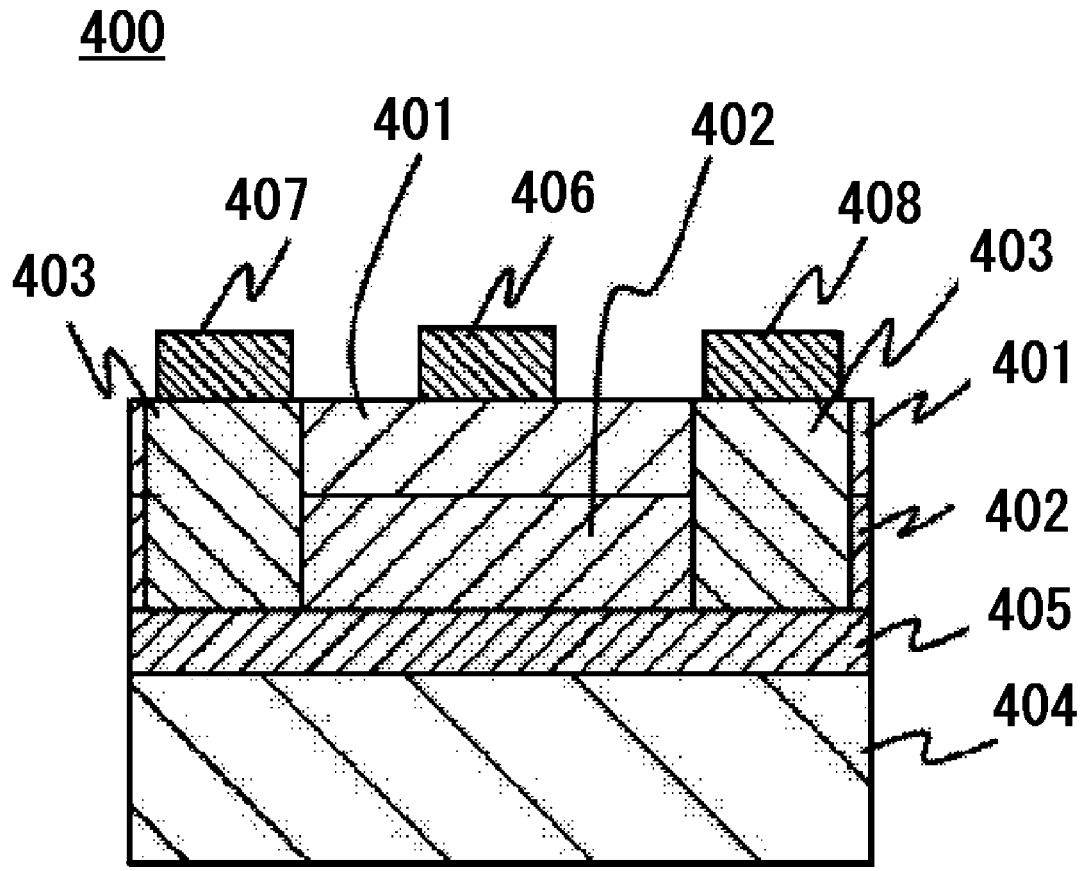

[FIG. 5]
500
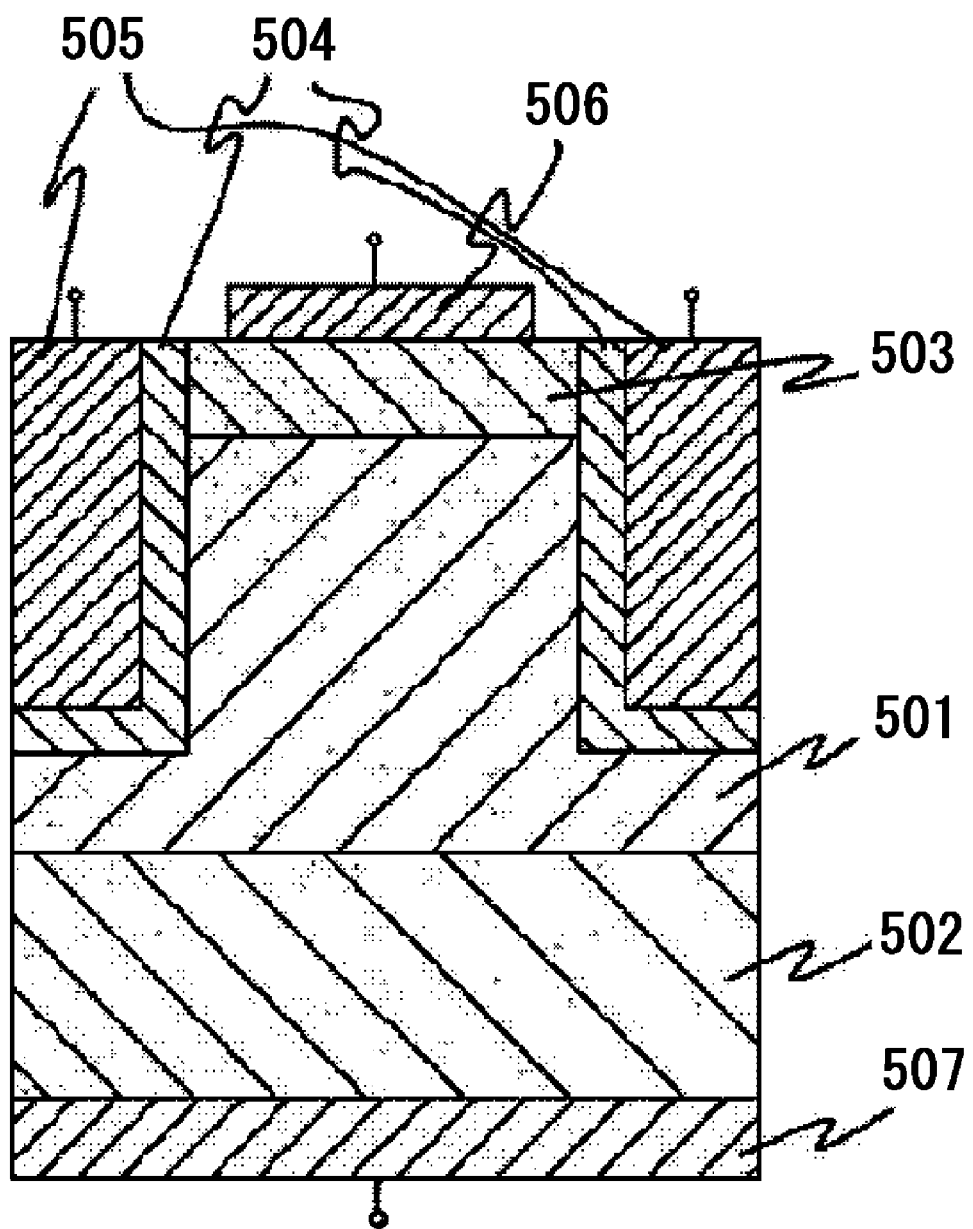

[FIG. 6]
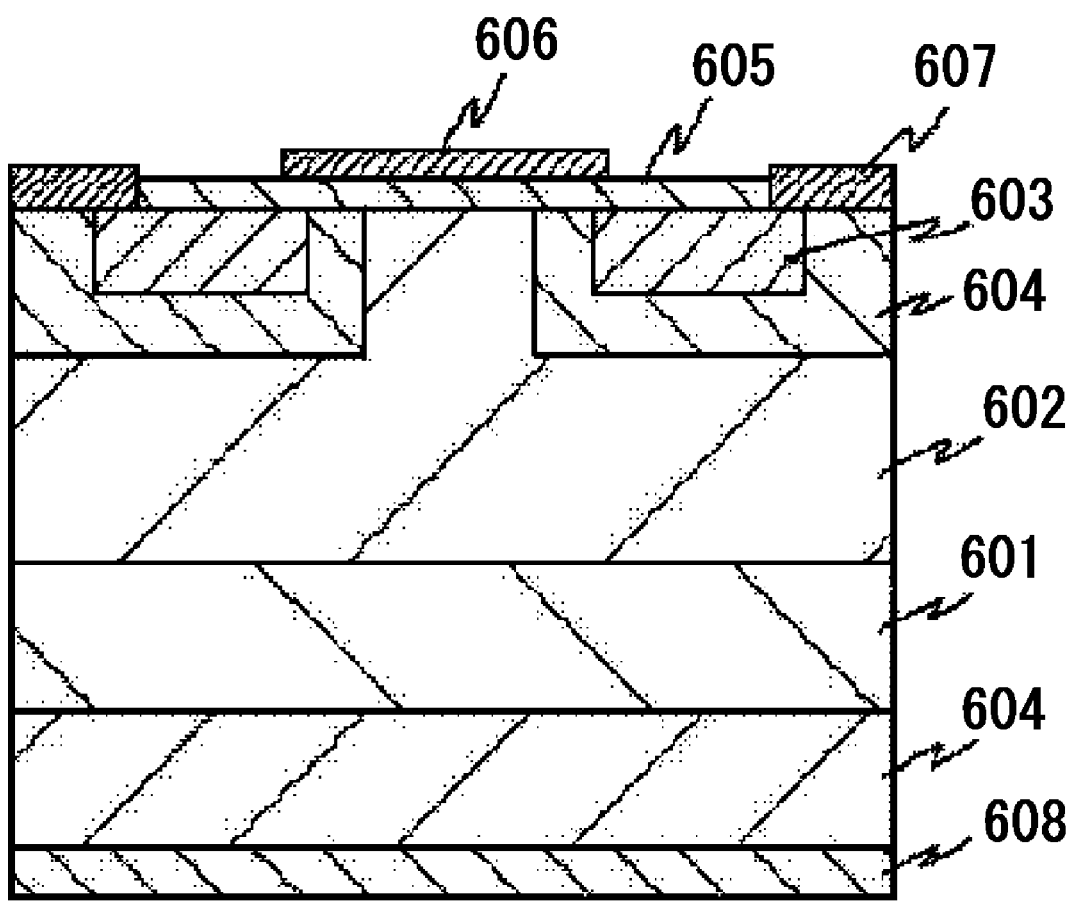

[FIG. 7]
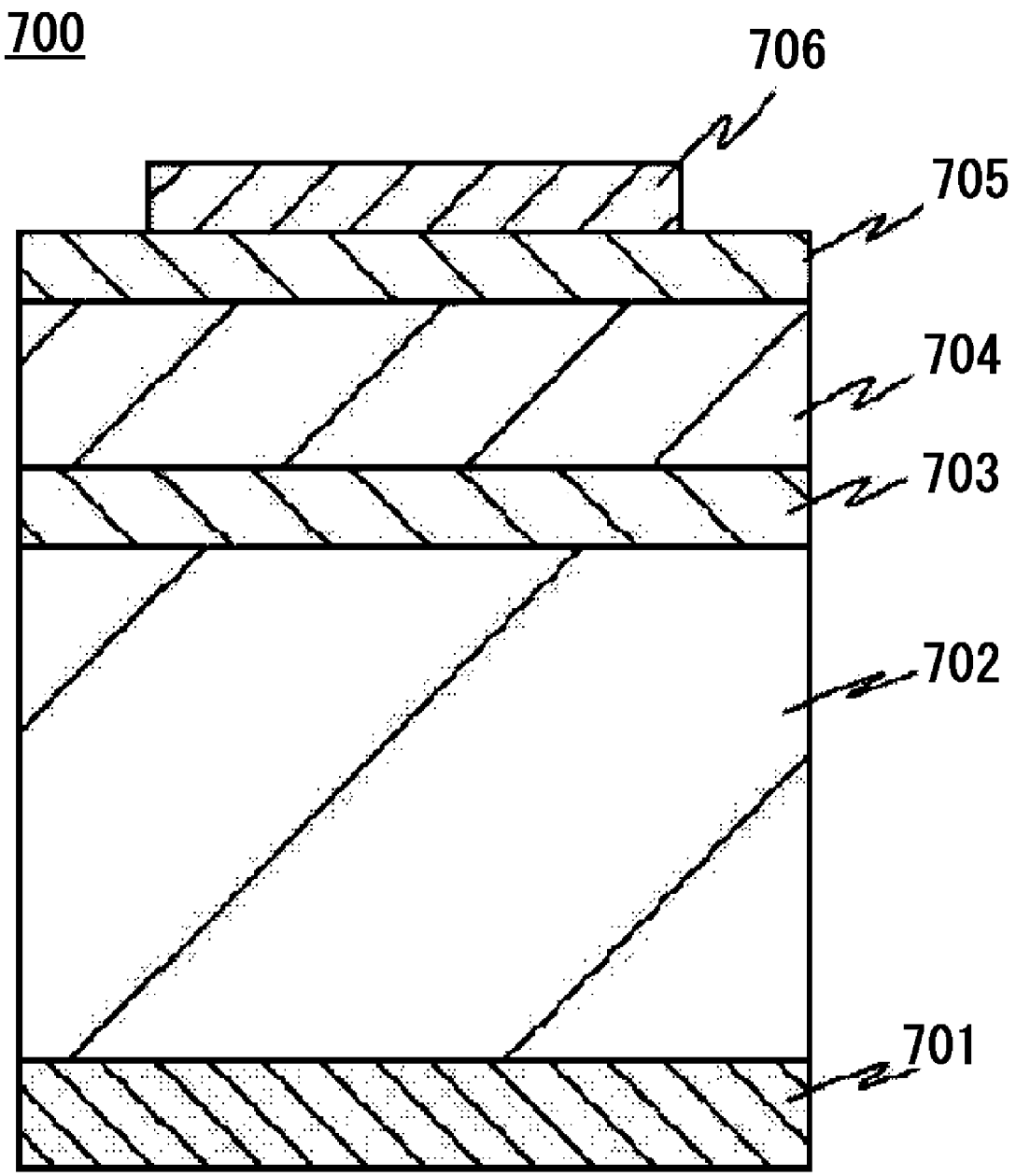

[FIG. 8]
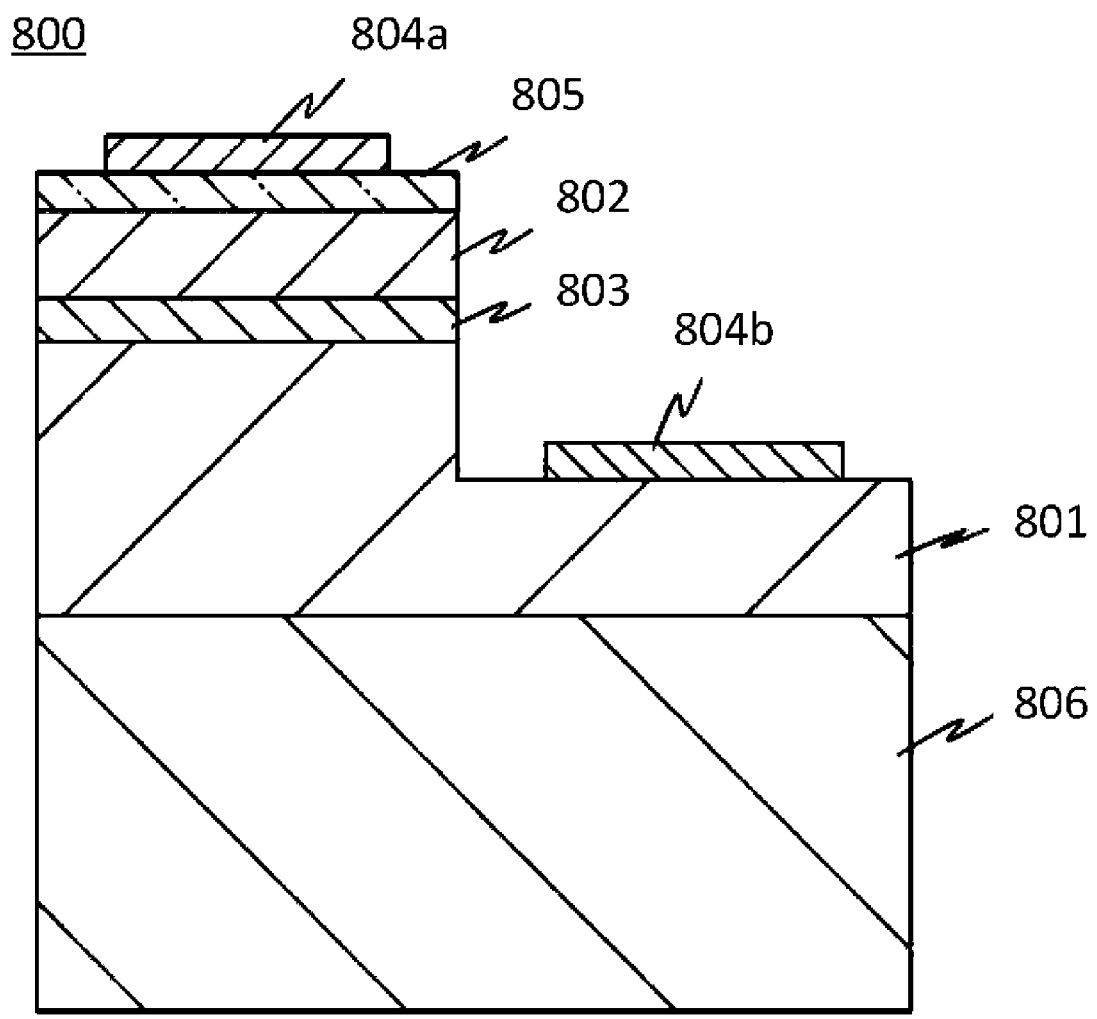

[FIG. 9]
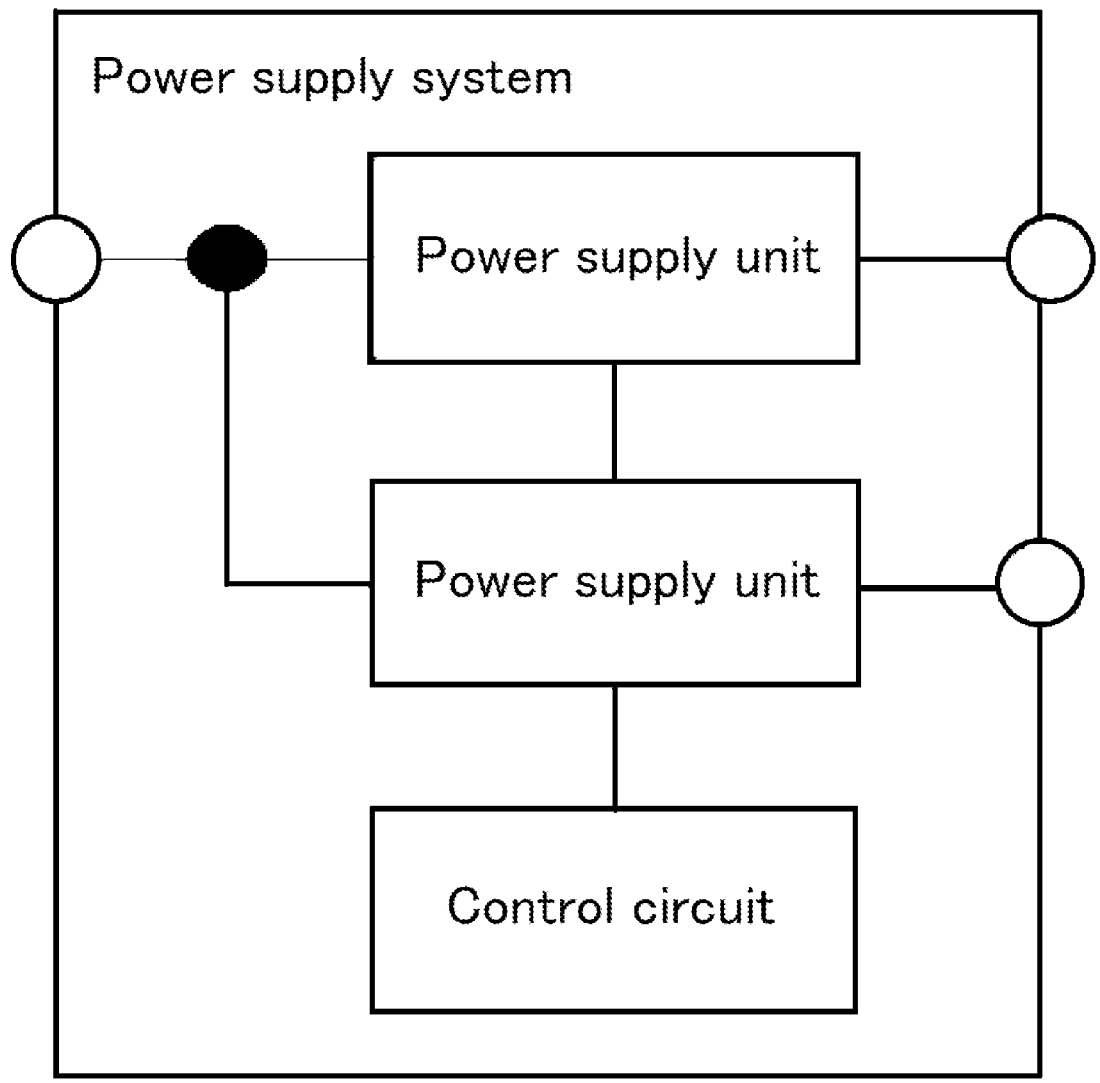

[FIG. 10]
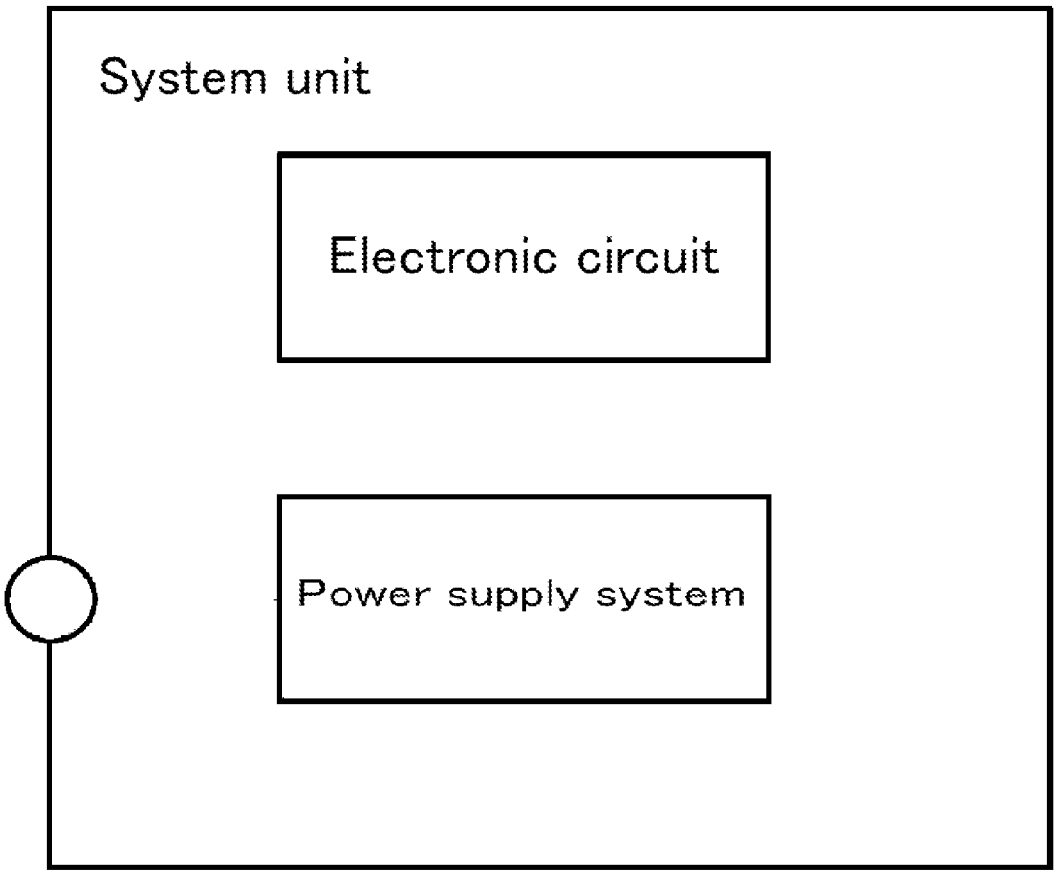
[FIG. 11]
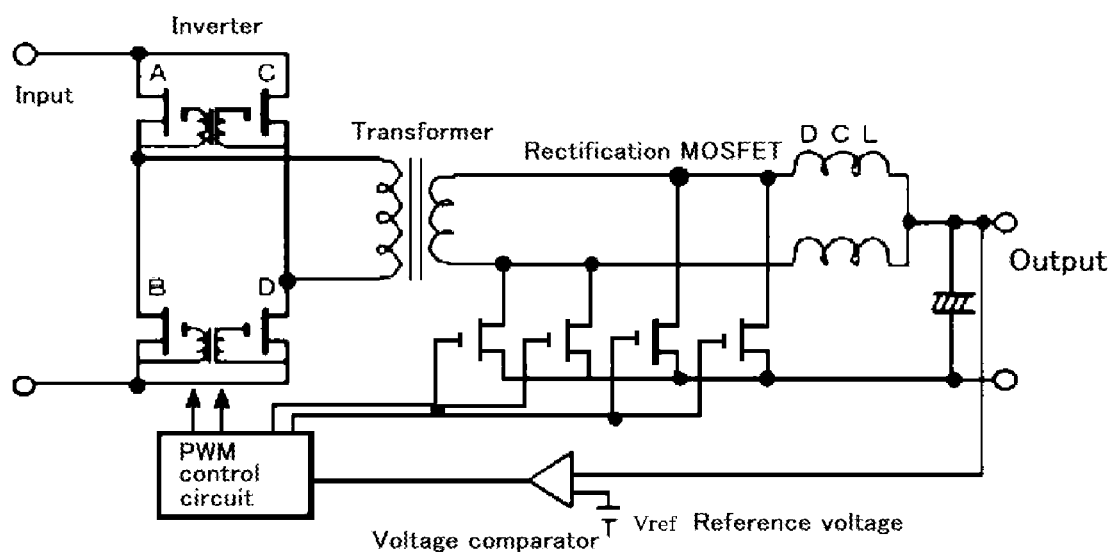

[FIG. 12]
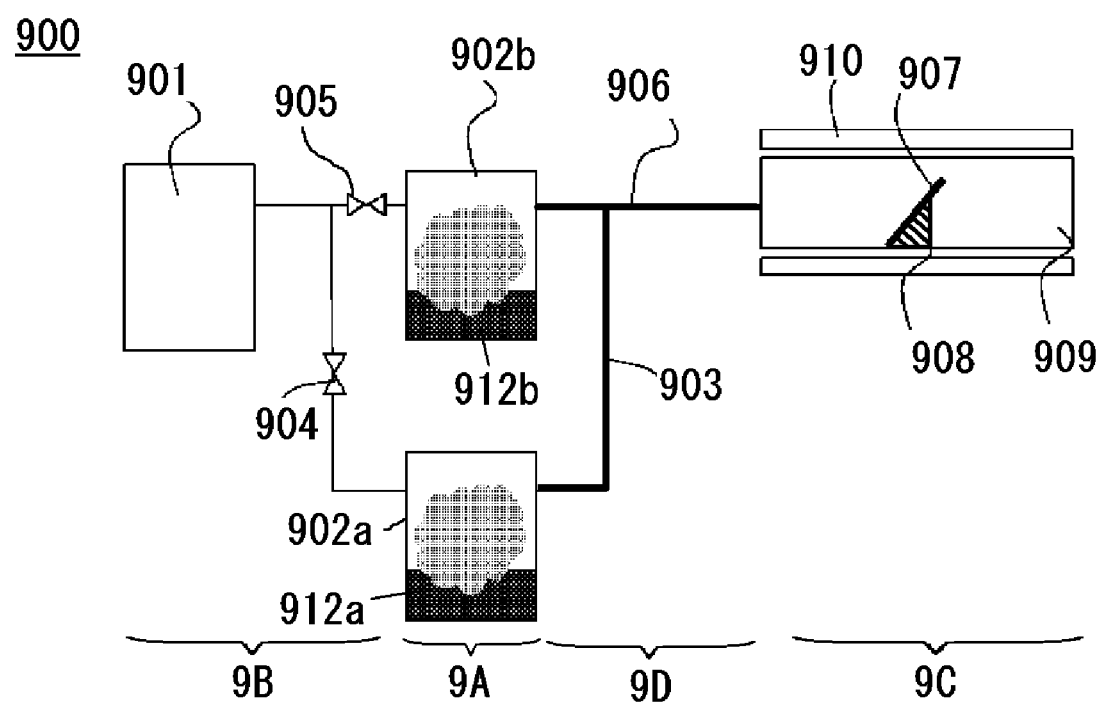

LAMINATE, FILM FORMING METHOD, AND FILM FORMING APPARATUS

TECHNICAL FIELD

The present invention relates to: a laminate including a semiconductor film having a corundum structure; a method for forming a semiconductor film; and a film forming apparatus.

BACKGROUND ART

As next-generation switching devices which can achieve high breakdown voltage, low loss, and high heat resistance, attention has been focused on semiconductor devices using gallium oxide ($Ga_2O_3$) having large bandgap. Their applications to power semiconductor devices, such as inverter, and light-emitting or -receiving devices are expected.

In recent years, Mist Chemical Vapor Deposition (Mist CVD. Hereinafter, this method may also be referred to as "mist CVD method") has been developed by which crystal is grown on a substrate using a raw material atomized into a mist form. This method enables production of gallium oxide (also referred to as α-gallium oxide or α-$Ga_2O_3$) having a corundum structure (Patent Document 1). In this method, a gallium compound such as gallium acetylacetonate is dissolved in an acid such as hydrochloric acid to prepare a precursor. This precursor is atomized to generate raw-material fine particles. A gas mixture in which the raw-material fine particles are mixed with a carrier gas is supplied to a surface of a substrate having corundum structure, such as sapphire. The raw-material mist is allowed to react, so that a single-orientation gallium oxide thin film is epitaxially grown on the substrate.

In order to use α-gallium oxide for a device, impurity-doping for providing charge carriers is necessary. For doping α-gallium oxide, it is known that Ge, Si, or Sn can be applied, in the manner of the historically older β-$Ga_2O_3$. For example, Patent Document 1 discloses that a minimum electric resistivity of 2000 mΩ·cm has been achieved by forming, on a c-plane sapphire substrate, an electro-conductive α-gallium oxide thin film doped with Sn. In addition, Patent Document 2 discloses a c-plane sapphire substrate with an α-gallium oxide thin film doped with Ge thereon. In addition, Non Patent Document 1 discloses that an electric resistivity of 200 mΩ·cm has been achieved by forming, on a c-plane sapphire substrate, an α-gallium oxide thin film doped with Sn.

CITATION LIST

Patent Literature

Patent Document 1: JP 2013-028480 A
Patent Document 2: JP 2015-228495 A

Non Patent Literature

Non Patent Document 1: Chikoidze, E., et al. "Electrical, optical, and magnetic properties of Sn doped α-$Ga_2O_3$ thin films.", Journal of Applied Physics 120.2 (2016): 025109.

SUMMARY OF INVENTION

Technical Problem

However, the electric resistivity of the α-gallium oxides disclosed in the above-described Patent Documents and Non Patent Document is still insufficient as semiconductor properties, and it has been difficult to form high-performance semiconductor devices.

The present invention has been made to solve the above-described problem, and an object thereof is to provide: a laminate including a semiconductor having low resistance and a corundum structure; a film forming method that makes it possible to obtain a semiconductor film having low resistance and a corundum structure; and a film forming apparatus that makes it possible to obtain a semiconductor film having low resistance and a corundum structure.

Solution to Problem

The present invention has been made to achieve the above-described object and provides a laminate comprising:
a crystal substrate; and
a semiconductor film provided on a main surface of the crystal substrate, the semiconductor film being mainly made of an oxide semiconductor containing a dopant and having a corundum structure, wherein
the oxide semiconductor has a silicon concentration of $5.0 \times 10^{20}$ cm$^{-3}$ or less, and the semiconductor film has a resistivity of 150 mΩ·cm or less.

Such a laminate has a low resistivity suitable for use in semiconductor devices.

In this event, the semiconductor film of the laminate can have a resistivity of 20 mΩ·cm or less.

In this way, the laminate can have a low resistivity more suitable for use in semiconductor devices.

In this event, the main surface of the semiconductor film of the laminate can be a c-plane.

In this manner, electrical properties can be further improved.

In this event, the dopant in the laminate can be at least one kind selected from tin, germanium, or silicon, and furthermore, the dopant in the laminate can be tin.

In this manner, electrical properties can be more improved.

In this event, the semiconductor film of the laminate can have a carrier mobility of 20 cm$^2$/Vs or more and a carrier density of $1.0 \times 10^{18}$/cm$^3$ or more.

In this manner, electrical properties can be more improved.

In this event, the oxide semiconductor of the laminate can contain gallium, indium, or aluminum, and furthermore, the oxide semiconductor of the laminate can contain at least gallium.

In this way, the laminate becomes applicable to semiconductor devices having high performance characteristics such as high breakdown voltage, low loss, and high heat resistance.

In this event, a semiconductor device comprising at least a semiconductor and an electrode, wherein the semiconductor comprises at least a portion of the above-described laminate can be provided, and furthermore, a semiconductor system comprising the semiconductor device can be provided.

In this way, a semiconductor device and a semiconductor system having high performance characteristics such as high breakdown voltage, low loss, and high heat resistance are possible.

In addition, the present invention provides a film forming method comprising the steps of:
forming a mixture gas containing at least an atomized metal oxide precursor, a carrier gas, and a dopant;

conveying the mixture gas to a film-forming unit via a conveyor; and forming a semiconductor film on a substrate by subjecting the mixture gas to a thermal reaction in the film-forming unit, wherein at least a surface in the conveyor that comes into contact with the mixture gas is a non-silicone resin.

According to such a film forming method, a semiconductor film having a low resistivity suitable for use in semiconductor devices can be formed.

In this event, in the film forming method, the non-silicone resin may contain any one or more of polyethylene, polypropylene, vinyl chloride, polystyrene, polyvinyl acetate, urethane resin, fluorine resin, acrylonitrile-butadiene-styrene resin, acrylic resin, polyamide, polyimide, polyamide imide, nylon, acetal resin, polycarbonate, polyphenylene ether, polyester, polyethylene terephthalate, polybutylene terephthalate, polyolefin, polyphenylene sulfide, polysulfone, polyether sulfone, polyarylate, and polyether ether ketone.

In this manner, a semiconductor film having a low resistivity suitable for use in semiconductor devices can be formed more certainly and stably.

In this event, in the film forming method, the non-silicone resin can contain a fluorine resin.

In this manner, a semiconductor film having a low resistivity suitable for use in semiconductor devices can be formed further certainly and stably.

Furthermore, the present invention provides a film forming apparatus comprising:

an atomizer for atomizing a raw-material solution and generating a mist;

a carrier-gas supplier for supplying a carrier gas to convey the mist;

a film-forming unit for forming a film on a substrate by subjecting the mist to a thermal reaction; and a conveyor that connects the atomizer to the film-forming unit, and through which the mist is conveyed by the carrier gas, wherein the conveyor is a non-silicone resin at least on a surface that comes into contact with the mist.

With such a film forming apparatus, a semiconductor film having a low resistivity suitable for use in semiconductor devices can be formed.

Advantageous Effects of Invention

As described above, according to the present invention, a laminate having a high-quality semiconductor with a corundum structure and with excellent electrical properties can be provided. In addition, according to the present invention, a high-quality semiconductor with a corundum structure and with excellent electrical properties can be produced easily and at low cost. In addition, according to the present invention, a film forming apparatus that makes it possible to produce a high-quality semiconductor with a corundum structure and with excellent electrical properties easily and at low cost can be provided.

BRIEF DESCRIPTION OF DRAWINGS

FIG. 1 is a diagram showing an embodiment of a laminate structure according to the present invention.

FIG. 2 is a diagram showing a different embodiment of the laminate structure according to the present invention.

FIG. 3 is a diagram showing an example of a Schottky barrier diode (SBD) schematically.

FIG. 4 is a diagram showing an example of a high electron mobility transistor (HEMT) schematically.

FIG. 5 is a diagram showing an example of a metal-oxide-semiconductor field-effect transistor (MOSFET) schematically.

FIG. 6 is a diagram showing an example of an insulated gate bipolar transistor (IGBT) schematically.

FIG. 7 is a diagram showing an example of a light-emitting device (LED) schematically.

FIG. 8 is a diagram showing another example of a light-emitting device (LED) schematically.

FIG. 9 is a diagram showing an example of a power supply system schematically.

FIG. 10 is a diagram showing an example of a system unit schematically.

FIG. 11 is a diagram showing an example of a power circuit diagram of a power supply unit schematically.

FIG. 12 is a diagram showing an embodiment of a mist CVD apparatus used for manufacturing a laminate according to the present invention.

DESCRIPTION OF EMBODIMENTS

Hereinafter, the present invention will be described in detail. However, the present invention is not limited thereto.

As described above, a laminate including a semiconductor having low resistance and a corundum structure suitable for use in semiconductor devices, a film forming method by which a semiconductor film having low resistance and a corundum structure can be obtained, and a film forming apparatus with which a semiconductor film having low resistance and a corundum structure can be obtained have been desired.

The present inventors have earnestly studied the above-described problems and found out that a laminate comprising: a crystal substrate; and a semiconductor film provided on a main surface of the crystal substrate, the semiconductor film being mainly made of an oxide semiconductor containing a dopant and having a corundum structure, wherein the oxide semiconductor has a silicon concentration of $5.0 \times 10^{20}$ cm$^{-3}$ or less, and the semiconductor film has a resistivity of 150 mΩ·cm or less has a low resistivity and is suitable for use in semiconductor devices, and the present invention has been completed.

In addition, the present inventors have found out that according to a film forming method comprising the steps of: forming a mixture gas containing at least an atomized metal oxide precursor, a carrier gas, and a dopant; conveying the mixture gas to a film-forming unit via a conveyor; and forming a semiconductor film on a substrate by subjecting the mixture gas to a thermal reaction in the film-forming unit, wherein at least a surface in the conveyor that comes into contact with the mixture gas is a non-silicone resin, a semiconductor film having low resistance suitable for use in semiconductor devices can be formed, and completed the present invention.

Furthermore, the present inventors have found out that with a film forming apparatus comprising: an atomizer for atomizing a raw-material solution and generating a mist; a carrier-gas supplier for supplying a carrier gas to convey the mist; a film-forming unit for forming a film on a substrate by subjecting the mist to a thermal reaction; and a conveyor that connects the atomizer to the film-forming unit, and through which the mist is conveyed by the carrier gas, wherein the conveyor is a non-silicone resin at least on a surface that comes into contact with the mist, a semiconductor film having low resistance suitable for use in semiconductor devices can be formed, and completed the present invention.

As described above, it is not possible to obtain a semiconductor film with a low resistivity by forming a semiconductor film having a corundum structure such as α-gallium oxide according to a conventional method. The present inventors have earnestly investigated a cause for this, and found out that the Si contained in the semiconductor film hinders the achievement of low resistance.

The inventors have found out for the first time that if the Si concentration in the semiconductor film exceeds $5.0 \times 10^{20}$ cm$^{-3}$, electric conduction of the semiconductor is considerably degraded, and resistivity no longer goes under 200 mΩ·cm. That is, the inventors have found out that by setting the Si concentration in the semiconductor film to $5.0 \times 10^{20}$ cm$^{-3}$ or less, a resistivity of the semiconductor film of 150 mΩ·cm or less can be achieved, and a semiconductor film having a corundum structure suitable for use in semiconductors can be achieved. To achieve a lower resistivity, a Si concentration of $3.0 \times 10^{20}$ cm$^{-3}$ or less is preferable.

The physical explanation for this phenomenon is not yet clear. However, it can be conjectured that due to the large amount of Si mixed in, defects are formed between the energy bands and impede the conduction of charge carriers, or else the dopant is inactivated, and the generation of charge carriers itself is impeded.

Hereinafter, the present invention will be described with reference to the drawings.

(Laminate)

FIG. 1 is a diagram showing an embodiment of a laminate according to the present invention. The laminate 100 is provided with a crystal substrate 101 and a semiconductor film 102 formed directly on the crystal substrate 101.

(Semiconductor Film)

The semiconductor film 102 is mainly made of an oxide semiconductor having a corundum structure, and furthermore, being an oxide semiconductor film containing a dopant with a Si concentration of $5.0 \times 10^{20}$ cm$^{-3}$ or less, more preferably $3.0 \times 10^{20}$ cm$^{-3}$ or less, and a resistivity of 150 m·Ωcm or less, more preferably 20 m·Ωcm or less. Note that the expression "mainly made of an oxide semiconductor" means a dopant or unavoidable impurities, etc. can be contained besides the oxide semiconductor, and refers to, for example, a semiconductor film containing about 50% or more of the oxide semiconductor. Note that the lower limit of the Si concentration is 0, but can also be $1 \times 10^{16}$ cm$^{-3}$. In addition, the lower limit of the resistivity is not particularly limited, but can be, for example, $1.0 \times 10^{-1}$ m·Ωcm.

In addition, the semiconductor film 102 preferably has a charge carrier mobility of 20 cm$^2$/Vs or more, more preferably 40 cm$^2$/Vs or more, and most preferably 50 cm$^2$/Vs or more. This mobility refers to the mobility obtained by a Hall effect measurement. Note that the upper limit of the mobility is not particularly limited, but can be, for example, 300 cm$^2$/Vs.

Furthermore, in the present invention, the semiconductor film 102 preferably has a carrier density of $1.0 \times 10^{18}$/cm$^3$ or more. This carrier density refers to the carrier density in the semiconductor film 102 obtained by a Hall effect measurement. Note that the upper limit of the carrier density is not particularly limited, but can be, for example, $1.0 \times 10^{21}$/cm$^3$.

In addition, the main surface of the semiconductor film 102 is preferably a c-plane. This is because a c-plane makes it comparatively easy to improve crystallinity, and as a result, electrical properties can be further improved.

In addition, the semiconductor film 102 preferably contains at least one of In, Ga, Al, Ir, V, Fe, Cr, and Ti as a metal component in the oxide semiconductor, and most preferably, is mainly made of Ga. Note that "mainly made of" referred to here is, when the oxide semiconductor is an α-gallium oxide, for example, it is sufficient for the α-gallium oxide to be contained so that the atomic ratio of the gallium among the metal elements in the film is 0.5 or more. In the present invention, the atomic ratio of the Ga among the metal elements in the film is preferably 0.7 or more, more preferably 0.8 or more.

Furthermore, the thickness of the semiconductor film 102 is not particularly limited. In addition, the shape, etc. of the main surface of the semiconductor film 102 is not particularly limited, and can be a quadrilateral shape (including square shapes and rectangular shapes), a circular shape (including semicircular shapes), or a polygonal shape. The surface area of the semiconductor film 102 is not particularly limited, and is preferably an area equivalent to 3 mm square or more, more preferably an area equivalent to 5 mm square or more. When forming on a circular substrate, a diameter of 50 mm or more is the most preferable. The semiconductor film 102 preferably does not have a crack in a 3 mm square region in the center, more preferably does not have a crack in a 5 mm square region in the center, and most preferably does not have a crack in a 9.5 mm square region in the center in an observation of the film surface with an optical microscope.

Furthermore, the semiconductor film 102 may be a single crystal or a polycrystalline film, but is preferably a single crystal film.

The semiconductor film 102 contains a dopant, but the dopant is not particularly limited, and can be a known dopant. Examples of the dopant include n-type dopants such as Sn, Ge, Si, Ti, Zr, V, Nb, and Pb; and p-type dopants such as Cu, Ag, Ir, and Rh; or the like. In the present invention, Sn, Ge, or Si can be applied as the dopant, more preferably Sn or Ge, and most preferably Sn. The content in the semiconductor film when Sn or Ge is used as the dopant can be $1 \times 10^{16}$ cm$^{-3}$ to $1 \times 10^{22}$ cm$^{-3}$, preferably $1 \times 10^{18}$ cm$^{-3}$ to $1 \times 10^{21}$ cm$^{-3}$. With such a range, a semiconductor film 102 having a low resistivity value and excellent electrical properties more suitable for use in semiconductor devices can be achieved.

The present invention has a characteristic that the Si contained in the semiconductor film is set to a predetermined range, but it is also possible to use Si as a dopant as described above. When Si is used as a dopant, the lower limit of the Si content in the semiconductor film is preferably $1 \times 10^{16}$ cm$^{-3}$. The Si content is more preferably $1 \times 10^{18}$ cm$^{-3}$ to $3 \times 10^{20}$ cm$^{-3}$. With such a range, a semiconductor film 102 that can suppress an increase in resistivity and provide sufficient electrical properties, and that at the same time has a low resistivity value and excellent electrical properties more suitable for use in semiconductor devices can be achieved.

(Substrate)

Meanwhile, the substrate 101 is not particularly limited as long as the substrate 101 is a crystal substrate on which an oxide semiconductor film having a corundum structure can be formed. It is preferable to use a substrate having a corundum structure on the entire main surface or a part of the main surface. A substrate having a corundum structure on the entire main surface or a part of the main surface on the crystal growth plane side is more preferable, and a substrate having a corundum structure on the entire main surface on the crystal growth plane side is further preferable. Specifically, α-Al$_2$O$_3$ (sapphire substrate) or α-gallium oxide are suitably used. In addition, in the present invention, the main surface is preferably a c-plane since electrical properties can be more improved. In addition, the main surface of the substrate 101 may have a crystal face having an off angle. In this case, generally, the off angle is preferably 0.1° to 10.0°.

Here, an off angle indicates the smaller of the angles formed by the normal vector of the main surface (surface) and the normal vector of a low-index surface of the semiconductor film or substrate. Note that in the present invention, the angles formed by the normal vector of the main surface (surface) of the semiconductor film or substrate and the normal vector of the crystal faces (for example, c-plane, a-plane, m-plane, and r-plane) defined in FIG. 1 of SEMI M65-0306 are compared, and the surface with the smallest angle is referred to as a low-index surface. In the present invention, when the substrate 101 has an off angle, the c-plane is preferably the main surface.

The shape of the substrate 101 is not particularly limited as long as the shape is a plate shape and acts as a support for the semiconductor film 102. In addition, the shape can also be a near circular shape (for example, a circle or an ellipse, etc.) or a polygonal shape (for example, a triangle, a square, a rectangle, a pentagon, a hexagon, a heptagon, an octagon, a nonagon, etc.), and various shapes can be used suitably. In the present invention, the shape of the semiconductor film 102 can be established by setting the shape of the substrate 101 to the desired shape. In addition, in the present invention, a substrate with a diameter of 50 mm or more, more preferably a large-area substrate with a diameter of 100 mm can also be used, and by using such a large-area substrate, the area of the semiconductor film 102 can be made large. In addition, the thickness of the substrate 101 is not particularly limited, but a thickness of 0.3 mm to 3 mm is suitable, and a thickness of 0.4 to 1 mm is more preferable. When the thickness is within such a range, warp can be made comparatively small, while at the same time, decrease in temperature while forming a film such as a semiconductor film can be suppressed, so that crystallinity becomes more stable and high.

FIG. 1 shows an example where a semiconductor film 102 is formed directly on a crystal substrate 101, but the semiconductor film 102 can also be formed on another layer formed on the substrate. The laminate 200 shown in FIG. 2 is an example where a stress relief layer 203 is provided between the crystal substrate 201 and the semiconductor film 202 as a middle layer. In this manner, the lattice mismatch between the crystal substrate 201 and the semiconductor film 202 is relieved and the crystallinity of the semiconductor film 202 is raised, so that electrical properties can be more improved.

For example, when an α-gallium oxide film is formed on an $\alpha$-$Al_2O_3$ substrate, $\alpha$-$Fe_2O_3$, $\alpha$-$Ga_2O_3$, $\alpha$-$Al_2O_3$, mixed crystals thereof and the like can be suitably used as a stress relief layer 203, for example. In this event, values of the lattice constant of the stress relief layer 203 preferably vary in a continuous or stepwise manner in a growth direction of the stress relief layer 203 from a similar or equivalent value to that of the lattice constant of the crystal substrate 201 to a similar or equivalent value to that of the lattice constant of the semiconductor film 202. That is, the stress relief layer 203 is preferably formed from $(Al_xGa_{1-x})_2O_3$ ($0 \leq x \leq 1$) such that the value of x is decreased from the substrate 201 side to the semiconductor 202 side.

The method for forming the stress relief layer 203 is not particularly limited, and can be a known method. The method can also be similar to the method for forming the semiconductor film 202. Note that the stress relief layer 203 may include a dopant or not include a dopant.

The semiconductor film according to the present invention not only has low resistance, but is also excellent in electrical properties, and is industrially useful. Such a semiconductor film can be suitably used for semiconductor devices and so forth, and is particularly useful for power devices. For example, the semiconductor film according to the present invention can be used for an n-type semiconductor layer (including $n^+$-type semiconductor layers and $n^-$-type semiconductor layers) of a semiconductor device. Moreover, the laminate according to the present invention may be used as it is, or may be applied to a semiconductor device or the like after using a known technique such as separating, etc. the semiconductor film from the crystal substrate or the like.

Meanwhile, semiconductor devices can be classified into: horizontal elements (horizontal devices) having an electrode formed on one side of a semiconductor layer; and vertical elements (vertical devices) having electrodes respectively on both of top and bottom sides of a semiconductor layer. At least a portion of the inventive laminate is suitably usable in both of horizontal and vertical devices. The inventive laminate is particularly preferably used in a vertical device.

Examples of the semiconductor device include Schottky barrier diode (SBD), metal-semiconductor field-effect transistor (MESFET), high electron mobility transistor (HEMT), metal-oxide-semiconductor field-effect transistor (MOSFET), junction field-effect transistor (JFET), insulated gate bipolar transistor (IGBT), light-emitting device (light-emitting diode, LED), etc.

Hereinafter, suitable examples where the laminate or semiconductor film according to the present invention is applied to n-type semiconductors (such as $n^+$-type semiconductor layers or $n^-$-semiconductor layers) to obtain semiconductor devices will be described with reference to the drawings. However, the present invention is not limited to these examples. Note that it goes without saying that semiconductor devices exemplified below may further include other layers (e.g., an insulator layer and a conductor layer) and the like depending on the specification or purpose. In addition, a middle layer, a buffer layer, and the like may be added or omitted as appropriate.

FIG. 3 is an example of a Schottky barrier diode (SBD). An SBD 300 includes: an $n^-$-type semiconductor layer 301a doped at a relatively low concentration; an $n^+$-type semiconductor layer 301b doped at a relatively high concentration; a Schottky electrode 302; and an ohmic electrode 303.

Materials of the Schottky electrode 302 and the ohmic electrode 303 may be known electrode materials. Examples of the electrode materials include metals such as Al, Mo, Co, Zr, Sn, Nb, Fe, Cr, Ta, Ti, Au, Pt, V, Mn, Ni, Cu, Hf, W, Ir, Zn, In, Pd, Nd, and Ag; alloys thereof; metal oxide conductive films such as tin oxide, zinc oxide, rhenium oxide, indium oxide, indium-tin oxide (ITO), and indium-zinc oxide (IZO); organic electro-conductive compounds such as polyaniline, polythiophene, and polypyrrole; mixtures and laminates thereof; etc.

The Schottky electrode 302 and the ohmic electrode 303 can be formed by known means, such as, for example, a vacuum deposition method or a sputtering method. More specifically, for example, when two of the above-described electrode materials (a first metal and a second metal) are used to form a Schottky electrode, a layer made of the first metal and a layer made of the second metal are stacked, and the layer made of the first metal and the layer made of the second metal are patterned by utilizing photolithography technique, so that the Schottky electrode can be formed.

When a reverse bias is applied to the SBD 300, a depletion layer (not shown) expands in the n⁻-type semiconductor layer 301a, so that the SBD 300 has a high breakdown voltage. Meanwhile, when a forward bias is applied, electrons flow from the ohmic electrode 303 to the Schottky electrode 302. Thus, the SBD to which the laminate or the semiconductor film according to the present invention is applied is excellent for high breakdown voltage and large current, the switching speed is fast, and the breakdown voltage and reliability are also excellent.

FIG. 4 is an example of a high electron mobility transistor (HEMT). A HEMT 400 includes an n-type semiconductor layer 401 with a wide band gap, an n-type semiconductor layer 402 with a narrow band gap, an n⁺-type semiconductor layer 403, a semi-insulator layer 404, a buffer layer 405, a gate electrode 406, a source electrode 407, and a drain electrode 408.

FIG. 5 is an example of a metal-oxide-semiconductor field-effect transistor (MOSFET). A MOSFET 500 includes an n⁻-type semiconductor layer 501, n⁺-type semiconductor layers 502 and 503, a gate insulator film 504, a gate electrode 505, a source electrode 506, and a drain electrode 507.

FIG. 6 is an example of an insulated gate bipolar transistor (IGBT). An IGBT 600 includes an n-type semiconductor layer 601, an n⁻-type semiconductor layer 602, an n⁺-type semiconductor layer 603, a p-type semiconductor layer 604, a gate insulator film 605, a gate electrode 606, an emitter electrode 607, and a collector electrode 608.

FIG. 7 is an example of a light-emitting device (light-emitting diode, LED). An LED 700 includes a first electrode 701, an n-type semiconductor layer 702, a light-emitting layer 703, a p-type semiconductor layer 704, a transparent electrode 705, and a second electrode 706.

Examples of the material of the transparent electrode 705 include oxide electro-conductive materials containing In or Ti, etc. More specific examples thereof include $In_2O_3$, ZnO, $SnO_2$, $Ga_2O_3$, $TiO_2$, and $CeO_2$; mixed crystals of two or more thereof; materials doped therewith; etc. When these materials are disposed by known means such as sputtering, the transparent electrode 705 can be formed. Additionally, after the transparent electrode 705 is formed, thermal anneal may be performed to make the transparent electrode 705 transparent.

Examples of the material of the first electrode 701 and the second electrode 706 include metals such as Al, Mo, Co, Zr, Sn, Nb, Fe, Cr, Ta, Ti, Au, Pt, V, Mn, Ni, Cu, Hf, W, Ir, Zn, In, Pd, Nd, and Ag; alloys thereof; metal oxide conductive films such as tin oxide, zinc oxide, rhenium oxide, indium oxide, indium-tin oxide (ITO), and indium-zinc oxide (IZO); organic electro-conductive compounds such as polyaniline, polythiophene, and polypyrrole; mixtures thereof; etc. The method of forming the electrode films is not particularly limited. The electrodes can be formed by a method appropriately selected in consideration of the suitability to the material and so forth. Examples of the method includes printing method; wet processes, such as spraying and coating methods; physical processes, such as vacuum deposition method, sputtering method, and ion plating method; chemical processes, such as CVD and plasma CVD methods; etc.

Furthermore, FIG. 8 shows a different embodiment of a light-emitting device (light-emitting diode, LED). The light-emitting device 800 of FIG. 8 has, on a substrate 806, an n-type semiconductor layer 801, a p-type semiconductor layer 802, a light-emitting layer 803, a transparent electrode 805, a first electrode 804a, and a second electrode 804b disposed on a part of an exposed surface of the n-type semiconductor layer 801 exposed by chipping off a part of the n-type semiconductor layer 801.

Some of the semiconductor devices exemplified above are used, for example, in systems and so forth that use a power supply unit. The power supply unit can be fabricated by known means by connecting the semiconductor device to a wiring pattern or the like, etc.

FIG. 9 shows an example of a power supply system. FIG. 9 configures a power supply system by using a plurality of power supply units and a control circuit. As shown in FIG. 10, the power supply system can be used in a system unit by combining with an electronic circuit. An example of a power circuit diagram of a power supply unit is shown in FIG. 11. FIG. 11 shows a power circuit of a power supply unit including a power circuit and a control circuit. A DC voltage is converted to AC with an inverter (configured by MOSFET: A to D) by switching at a high frequency, then insulation and voltage transformation are performed by a transformer, and rectification is performed in a rectification MOSFET (A and B). Subsequently, smoothing is performed in a DCL (smoothing coils L1 and L2) and a condenser, and a direct current voltage is output. In this event, the output voltage is compared with a reference voltage using a voltage comparator, and the inverter and the rectification MOSFET are controlled by a PWM control circuit to achieve the desired output voltage.

Next, an example of an apparatus and method for manufacturing the inventive laminate shown in FIG. 1 will be described with reference to FIG. 12, particularly focusing on an apparatus and method for forming a semiconductor film. However, the present invention is not limited thereto.

(Film Forming Apparatus)

FIG. 12 shows an example of an apparatus used in the method for manufacturing a laminate according to the present invention. In manufacturing a laminate according to the present invention, a mist CVD apparatus 900 is used as a film forming apparatus for forming a semiconductor film.

Here, "mist" in the present invention is a general term for fine particles of a liquid dispersed in a gas, and also means what is called fog, droplet, etc.

A mist CVD apparatus 900 includes: an atomizer 9A for atomizing a raw-material solution and generating a mist; a carrier-gas supplier 9B for supplying a carrier gas to convey the mist; a film-forming unit 9C for forming a film on a substrate by subjecting the mist to a thermal reaction; and a conveyor 9D that connects the atomizer 9B to the film-forming unit 9C, and through which the mist is conveyed by the carrier gas.

(Conveyor)

Firstly, the conveyor 9D, which connects the atomizer 9A to the film-forming unit 9C will be described. The inventive film forming apparatus has a characteristic that the conveyor is a non-silicone resin at least on a surface that comes into contact with the mist in the mixture gas. The present inventors, having found out that the Si in the semiconductor film is an obstacle to achieving low resistivity as described above, have earnestly studied, and found out that in a film forming apparatus, Si is taken into the semiconductor film by the raw material coming into contact with components configuring the film forming apparatus between being atomized and being subjected to a reaction in the film-forming unit. Accordingly, the present inventors have found out that Si can be prevented from being taken in when forming a semiconductor film when a surface (portion) that comes into contact with the mist in the mixture gas in the conveyor 9D connecting the atomizer 9A to the film-forming unit 9C is a material containing no Si, in particular, a non-silicone resin.

The structure of the conveyor 9D is not particularly limited, but it is easiest to adopt a pipe. In this event, it is sufficient for a surface that comes into contact with the mist to be a non-silicone resin. It is also possible to use a silicon-containing material such as a silicone resin on the outside, and a non-silicone resin only on an inner surface that comes into contact with the mist.

When conveyance pipes 903 and 906 are adopted as the conveyor 9D, the material for the conveyance pipes 903 and 906 can be appropriately selected according to a solvent of a precursor or the temperature in the exchange between a reactor and the conveyance pipe and so forth as long as the material is a non-silicone resin. In the inventive film forming apparatus, a pipe made of a resin is preferably used. A pipe made of a resin has flexibility, and handling and designing of the entire film forming apparatus becomes easy.

Specific materials for the pipe made of a resin including polyethylene, polypropylene, vinyl chloride, polystyrene, polyvinyl acetate, urethane resin, fluorine resin, acrylonitrile-butadiene-styrene resin, acrylic resin, polyamide, polyimide, polyamide imide, nylon, acetal resin, polycarbonate, polyphenylene ether, polyester, polyethylene terephthalate, polybutylene terephthalate, polyolefin, polyphenylene sulfide, polysulfone, polyether sulfone, polyarylate, and polyether ether ketone can be suitably used. In particular, a fluorine resin is more preferably used. By using these resins for the surface in the conveyor that comes into contact with the mist, Si can be prevented effectively from being mixed into the mist, so that a semiconductor film excellent in electrical properties can be obtained.

The example of the conveyor 9D illustrated in FIG. 12 shows a structure in which the atomizing unit 902b is connected to the film forming chamber 909 with a conveyance pipe 906, and a conveyance pipe 903 from the atomizing unit 902a merges with an intermediate portion of the conveyance pipe 906. Nevertheless, the conveyance pipe 903 and the conveyance pipe 906 may be connected to the film forming chamber 909 independently of each other. In addition, this is not limiting, and a first mixture gas and a second mixture gas can be introduced into a single buffer tank (not shown), and the mist mixed in the buffer tank can be conveyed to the film forming chamber 909 via a conveyance pipe.

(Atomizer)

The atomizer 9A includes, for example, atomizing units 902a and 902b. A first precursor 912a and a second precursor 912b are accommodated as raw-material solutions in the atomizing units 902a and 902b respectively. Examples of the first precursor 912a and the second precursor 912b include acid solutions obtained by dissolving organometallic complexes (e.g., acetylacetonate complex etc.) of a metal or a metal in acid; aqueous solutions of halides (e.g., fluoride, chloride, bromide, iodide, etc.); etc. The metal is not limited, as long as the metal can form a corundum structure as metal oxide crystal. Examples of the metal include Al, Ti, V, Cr, Fe, Ga, Rh, In, and Ir. Moreover, the components of the first precursor 912a and the second precursor 912b may be identical to or different from the other. Furthermore, the number of atomizing units and the kinds of precursor can be increased or decreased in accordance with the composition or stacked structure of the film to be formed on a substrate. The metal content in each raw-material solution is not particularly limited, and can be appropriately set depending on the purpose or specification. The metal content is preferably 0.001 mol % to 50 mol %, more preferably 0.01 mol % to 5 mol %.

In addition, the solvent of the raw-material solution is not particularly limited, may be an inorganic solvent such as water, may be an organic solvent such as an alcohol, or may be a mixture solvent of an inorganic solvent with an organic solvent. Water is preferably used.

Doping is performed in order to impart electric conductivity to the semiconductor film, and the impurity material to be used is not particularly limited. For example, a complex or compound each containing Si, Ge, or Sn can be suitably used when the metal contains at least Ga. In particular, tin halide is preferably used. Such impurity materials can be mixed and used in an amount of 0.0001% to 20%, more preferably 0.001% to 10% relative to the metal element concentration in the raw-material solution.

In the atomizer 9A, the raw-material solutions are atomized using an atomizing (also referred to as "forming into droplets") means not shown. The atomization of the raw-material solutions is not particularly limited as long as the raw-material solutions can be atomized, but an atomization means that uses ultrasonic waves is preferable. A mist obtained by using ultrasonic waves has an initial velocity of zero and floats in the air, and for example, the mist can be conveyed in a state of floating in space rather than be blown as with a spray. Therefore, damage due to collision energy can be suppressed, and the means is particularly suitable.

(Carrier-Gas Supplier)

The carrier-gas supplier 9B is a supply means that supplies the carrier gas 901 for conveying the mist. Regarding the carrier-gas supplier 9B, the carrier gas 901 used is not particularly limited. For example, inert gases such as nitrogen and argon, or reducing gases such as hydrogen gas and forming gas, are suitably used besides air, oxygen, and ozone. Regarding the type of the carrier gas, one type or two or more types may be used. In addition, the carrier-gas supplier 9B is appropriately provided with: a pipe or the like for connecting to the atomizer 9A; and a gas flow adjustment means such as valves 904 and 905.

In addition, although not shown, it is also possible to add a dilution gas to adjust the ratio between the atomized raw material and the carrier gas. The flow rate of the dilution gas can be appropriately set, and can be 0.1 to 10 times as high as that of the carrier gas per minute. The dilution gas may be supplied downstream of the atomizing units 902a and 902b, for example. The dilution gas to be used may be the same as or different from the carrier gas.

(Film-Forming Unit)

The film-forming unit 9C includes a film forming chamber 909 that has a susceptor 908 inside. The structure and so forth of the film forming chamber 909 are not particularly limited. A metal such as aluminum or stainless steel may be used. When a film is formed at a temperature higher than the heat-resistance temperatures of these metals, quartz or silicon carbide may be used. Inside or outside the film forming chamber 909, a heating means 910 is provided to heat a crystal substrate 907. Moreover, the substrate 907 may be placed on a susceptor 908 disposed in the film forming chamber 909.

A specific example of the inventive film forming method will be described with reference to FIG. 12.

(Film Forming Method)

The inventive film forming method includes the steps of: forming a mixture gas containing at least an atomized metal oxide precursor, a carrier gas, and a dopant; conveying the mixture gas to a film-forming unit via a conveyor; and forming a semiconductor film on a substrate by subjecting the mixture gas to a thermal reaction in the film-forming unit, where at least a surface in the conveyor that comes into contact with the mixture gas is a non-silicone resin.

(Formation of Mixture Gas)

Firstly, a raw-material solution is atomized in the atomizer 9A by a known means to form a mist. The size of the mist is not particularly limited, and can be droplets of about several mm, but is preferably 50 μm or less, more preferably 0.1 to 10 μm.

The carrier gas supplied from the carrier-gas supplier to the atomizer 9A is mixed with the atomized raw-material solutions (precursors) formed in the atomizing units 902a and 902b to form a mixture gas.

The flow rate of the carrier gas can be appropriately set depending on the size of the substrate and the volume of the film forming chamber, and can be approximately 0.01 to 40 L/minute. Furthermore, the film formation may be performed under pressure, reduced pressure, or atmospheric pressure, preferably under atmospheric pressure in view of apparatus cost and productivity.

(Conveyance of Mixture Gas)

The mixture gas including the mist is conveyed via the conveyor 9D connecting the atomizer 9A to the film-forming unit 9C. In this event, the surface in the conveyor that comes into contact with the mixture gas is a non-silicone resin, and therefore, Si can be suppressed from being mixed in the mist in the mixture gas.

(Formation of Semiconductor Film)

The mixture gas including the mist supplied to the film forming chamber 909 of the film-forming unit 9C undergoes reaction on the crystal substrate 907 heated by the heat source 910 to thereby form the semiconductor film having a corundum structure in the film forming chamber 909. The substrate temperature at this time should be appropriately determined depending on the kind of film to be formed on the substrate, and when forming an α-gallium oxide film, for example, the temperature is preferably 350° C. or higher and 950° C. or lower. Within such a range, a semiconductor film with higher crystallinity can be obtained. Note that the film thickness can be set by adjusting the film formation time, the atomized amount of precursor, and the carrier-gas flow rate.

Different Example of Film Forming Method

In a case where a stress relief layer is further formed between the semiconductor layer and the substrate, firstly, a first mixture gas, being a mixture of a carrier gas 901 and an atomized first precursor formed in the atomizing unit 902a, is formed. A second mixture gas, being a mixture of a carrier gas 901 and an atomized second precursor formed in the atomizing unit 902b is further formed.

Next, the first mixture gas and the second mixture gas is conveyed onto the crystal substrate 907 which is placed on the susceptor 908 in the film forming chamber 909, and which has been heated by the heating means 910. Thus, the precursor reacts on the substrate surface, and a semiconductor having a corundum structure and having a mixture of the component of the first precursor and the component of the second precursor is formed. Here, the carrier-gas flow rate of both or one of the first mixture gas and the second mixture gas can be discretely or continuously changed over a predetermined time. When a stress relief layer is formed between a sapphire substrate and a gallium oxide, for example, the stress relief layer is preferably formed from $(Al_xGa_{1-x})_2O_3$ ($0 \leq x \leq 1$) such that the value of x is decreased from the substrate side towards the growth direction side. To achieve this, the concentration of each precursor or carrier-gas flow rate is adjusted when supplying the first mixture gas containing an Al source and the second mixture gas containing a Ga source to the film forming chamber 909, so that the supplied amount of Al becomes relatively larger than the supplied amount of Ga. Alternatively, it is also possible to form the first film with a mixture gas using an Al—Ga precursor, being a mixture of the Al source and the Ga source at a certain ratio. Subsequently, stacking can be repeated using a plurality of Al—Ga precursors having the Al concentration decreased relatively and in a stepwise manner to form a multilayer film of $(Al_xGa_{1-x})_2O_3$ having the Al composition reduced in a stepwise manner. Furthermore, the substrate temperature at this time should be appropriately determined depending on the kind of film to be formed on the substrate. For example, when forming a $(Al_xGa_{1-x})_2O_3$ ($0 \leq x \leq 1$) film, the temperature is preferably 350° C. or higher and 950° C. or lower. Within such a range, a semiconductor film with higher crystallinity can be obtained. Incidentally, the film thickness can be set by adjusting the film formation time.

EXAMPLE

Hereinafter, the present invention will be described in detail with reference to Examples. However, the present invention is not limited thereto.

Example 1

An α-gallium oxide film was formed by the following procedure using only one atomizing unit in the film forming apparatus of FIG. 12. Firstly, an aqueous solution of gallium acetylacetonate was prepared such that the Ga concentration was 0.10 mol/L. To this aqueous solution, tin chloride (II) was added so that the atomic ratio of Sn to the Ga concentration was 1:0.005, and 1.0% by volume of a hydrochloric acid was further added to give a raw-material solution. This raw-material solution was loaded to the atomizing unit.

Next, a c-plane sapphire substrate with a diameter of 2 inches (50 mm) having an α-$(Al_xGa_{1-x})_2O_3$ multilayer film (not doped, $0.02 \leq x \leq 0.2$) formed on the surface thereof as a buffer layer was placed on a susceptor made of quartz, disposed in a tubular film forming chamber made of quartz, and the substrate temperature was maintained at 430° ° C. using a heater.

Next, with a 2.4-MHz ultrasonic transducer, the raw-material solution in the atomizing unit was atomized. Subsequently, a carrier gas nitrogen was introduced into the atomizing unit at 1.0 L/min, and a dilution gas nitrogen was further introduced into the atomizing unit at 0.5 L/min to form a mixture gas. The mixture gas was supplied to the film forming chamber through a conveyance pipe (PTFE pipe) made of polytetrafluoroethylene, and a film was formed under atmospheric pressure for 60 minutes to form an α-gallium oxide film with a film thickness of 3.5 μm.

Subsequently, the substrate was taken out of the film forming chamber after cooling to room temperature, and the carrier concentration, resistivity, and mobility were measured by a Van der Pauw method (accent HL5500). In addition, the Si concentration in the film was measured by SIMS (CAMECA IMS-7f). Note that the detection limit of Si in this measurement is $5 \times 10^{14}$ cm$^{-3}$.

Example 2

An α-gallium oxide film with a film thickness of 3.5 μm was formed in the same manner as in Example 1 except that the conveyance pipe for the mixture gas was changed to a pipe made of vinyl chloride. Subsequently, the substrate was taken out of the film forming chamber after cooling to room temperature, and the carrier concentration, resistivity, mobility, and Si concentration in the film were measured in the same manner as in Example 1.

Example 3

An α-gallium oxide film with a film thickness of 3.5 μm was formed in the same manner as in Example 1 except that the conveyance pipe for the mixture gas was changed to a pipe made of polyethylene. Subsequently, the substrate was taken out of the film forming chamber after cooling to room temperature, and the carrier concentration, resistivity, mobility, and Si concentration in the film were measured in the same manner as in Example 1.

Example 4

An α-gallium oxide film with a film thickness of 3.5 μm was formed in the same manner as in Example 1 except that the conveyance pipe for the mixture gas was changed to a pipe made of urethane resin. Subsequently, the substrate was taken out of the film forming chamber after cooling to room temperature, and the carrier concentration, resistivity, mobility, and Si concentration in the film were measured in the same manner as in Example 1.

Example 5

A film was formed in the same manner as in Example 1 except for the following points: an aqueous solution of gallium chloride was prepared so that the Ga concentration was 0.10 mol/L; to the aqueous solution, germanium oxide was added so that the atomic ratio of the Ge, being the dopant, to the Ga concentration was 1:0.005; 1.0% by volume of a hydrochloric acid was further added; and the resultant was used as a raw-material solution. Thus, an α-gallium oxide film with a film thickness of 2.0 μm was formed. Subsequently, the substrate was taken out of the film forming chamber after cooling to room temperature, and the carrier concentration, resistivity, mobility, and Si concentration in the film were measured in the same manner as in Example 1.

Comparative Example 1

An α-gallium oxide film with a film thickness of 3.5 μm was formed in the same manner as in Example 1 except that the conveyance pipe for the mixture gas was changed to a pipe made of silicone resin. Subsequently, the substrate was taken out of the film forming chamber after cooling to room temperature, and the carrier concentration, resistivity, mobility, and Si concentration in the film were measured in the same manner as in Example 1.

Comparative Example 2

An α-gallium oxide film with a film thickness of 2.0 μm was formed in the same manner as in Example 5 except that the conveyance pipe for the mixture gas was changed to a pipe made of silicone resin. Subsequently, the substrate was taken out of the film forming chamber after cooling to room temperature, and the carrier concentration, resistivity, mobility, and Si concentration in the film were measured in the same manner as in Example 1.

Table 1 shows the carrier density, mobility, and resistivity of the α-gallium oxide films obtained in Examples 1 to 5 and Comparative Examples 1 and 2. In the semiconductor films of the inventive laminates, Si was not detected (less than the detection limit), and resistivity of about 4 mΩ·cm, which is an extremely low resistivity compared with the Comparative Examples, was achieved. Semiconductor films with a high carrier concentration and high mobility, and with excellent electrical properties were successfully obtained.

TABLE 1

|  | Carrier concentration [$cm^{-3}$] | Resistivity [$m\Omega \cdot cm$] | Mobility [$cm^2/Vs$] | Si concentration [$cm^{-3}$] |
| --- | --- | --- | --- | --- |
| Example 1 | $3.01 \times 10^{19}$ | 4.1 | 54.81 | Not detected |
| Example 2 | $2.88 \times 10^{19}$ | 4.3 | 51.53 | Not detected |
| Example 3 | $2.92 \times 10^{19}$ | 4.2 | 51.60 | Not detected |
| Example 4 | $2.85 \times 10^{19}$ | 4.3 | 52.17 | Not detected |
| Example 5 | $2.90 \times 10^{19}$ | 4.0 | 53.41 | Not detected |
| Comparative Example 1 | $8.34 \times 10^{17}$ | 598.3 | 13.35 | $5.3 \times 10^{20}$ |
| Comparative Example 2 | $6.50 \times 10^{17}$ | 740.2 | 12.99 | $6.7 \times 10^{20}$ |

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A film forming method comprising the steps of:
   forming a mixture gas containing at least an atomized metal oxide precursor, a carrier gas, and a dopant;
   conveying the mixture gas to a film-forming unit via a conveyor; and
   forming a semiconductor film on a substrate by subjecting the mixture gas to a thermal reaction in the film-forming unit,
   wherein:
   at least a surface in the conveyor that comes into contact with the mixture gas is a non-silicone resin, and
   the non-silicone resin contains any one or more of polyethylene, polypropylene, vinyl chloride, polystyrene, polyvinyl acetate, urethane resin, acrylonitrile-butadiene-styrene resin, acrylic resin, polyamide, polyimide, polyamide imide, nylon, acetal resin, polycarbonate, polyphenylene ether, polyester, polyethylene terephthalate, polybutylene terephthalate, polyolefin, polyphenylene sulfide, polysulfone, polyether sulfone, polyarylate, and polyether ether ketone.

2. A film forming apparatus comprising:
   an atomizer configured to atomize a raw-material solution and generate a mist;
   a carrier-gas supplier configured to supply a carrier gas to convey the mist;
   a film-forming unit configured to form a film on a substrate by subjecting the mist to a thermal reaction; and
   a conveyor that connects the atomizer to the film-forming unit, and through which the mist is conveyed by the carrier gas,
   wherein:
   the conveyor is a non-silicone resin at least on a surface that comes into contact with the mist, and the non-silicone resin contains any one or more of polyethylene, polypropylene, vinyl chloride, polystyrene, polyvinyl acetate, urethane resin, acrylonitrile-butadiene-styrene resin, acrylic resin, polyamide, polyimide, polyamide imide, nylon, acetal resin, polycarbonate, polyphenylene ether, polyester, polyethylene terephthalate, polybutylene terephthalate, polyolefin, polyphenylene sulfide, polysulfone, polyether sulfone, polyarylate, and polyether ether ketone.

* * * * *